(12) United States Patent
Sadjadi et al.

(10) Patent No.: US 10,177,050 B2
(45) Date of Patent: Jan. 8, 2019

(54) METHODS AND APPARATUS FOR CONTROLLING SUBSTRATE UNIFORMITY

(71) Applicant: Applied Materials, Inc., Santa Clara, CA (US)

(72) Inventors: S. M. Reza Sadjadi, San Jose, CA (US); Dmitry Lubomirsky, Cupertino, CA (US); Hamid Noorbakhsh, Fremont, CA (US); John Zheng Ye, Santa Clara, CA (US); David H. Quach, San Jose, CA (US); Sean S. Kang, San Ramon, CA (US)

(73) Assignee: Applied Materials, Inc., Santa Clara, CA (US)

(*) Notice: Subject to any disclaimer, the term of this patent is extended or adjusted under 35 U.S.C. 154(b) by 354 days.

(21) Appl. No.: 15/212,938

(22) Filed: Jul. 18, 2016

(65) Prior Publication Data

US 2016/0329256 A1 Nov. 10, 2016

Related U.S. Application Data

(62) Division of application No. 13/766,238, filed on Feb. 13, 2013, now Pat. No. 9,412,579.
(Continued)

(51) Int. Cl.
*C23C 14/54* (2006.01)
*C23C 16/458* (2006.01)
(Continued)

(52) U.S. Cl.
CPC .............. *H01L 22/20* (2013.01); *C23C 14/22* (2013.01); *C23C 16/44* (2013.01);
(Continued)

(58) Field of Classification Search
CPC . C23C 14/54; C23C 16/4581; C23C 16/4585; C23C 15/4586; C23C 16/509; C23C 16/5093
See application file for complete search history.

(56) References Cited

U.S. PATENT DOCUMENTS

| | | |
|---|---|---|
| 4,464,223 A | 8/1984 | Gorin |
| 4,585,516 A | 4/1986 | Corn et al. |

(Continued)

FOREIGN PATENT DOCUMENTS

| | | | |
|---|---|---|---|
| EP | 0972092 | * 5/2005 | ............. C23C 16/00 |
| KP | 10-2011-0047084 A | 5/2011 | |
| KR | 10-2009-0050606 A | 5/2009 | |

OTHER PUBLICATIONS

Harberts, Megan, et al., "Chemical Vapor Deposition of an Organic Magnet, Vanadium Tetracyanoethylene." Journal of Visualized Experiments (101), e52891 (2015), pp. 1-9.*

(Continued)

*Primary Examiner* — Bret P Chen
(74) *Attorney, Agent, or Firm* — Patterson + Sheridan, LLP

(57) ABSTRACT

A dynamically tunable process kit, a processing chamber having a dynamically tunable process kit, and a method for processing a substrate using a dynamically tunable process kit are provided. The dynamically tunable process kit allows one or both of the electrical and thermal state of the process kit to be changed without changing the physical construction of the process kit, thereby allowing plasma properties, and hence processing results, to be easily changed without replacing the process kit. The processing chamber having a dynamically tunable process kit includes a chamber body that includes a portion of a conductive side wall configured to be electrically controlled, and a process kit. The processing chamber includes a first control system operable to
(Continued)

control one or both of an electrical and thermal state of the process kit and a second control system operable to control an electrical state of the portion of the side wall.

12 Claims, 5 Drawing Sheets

Related U.S. Application Data

(60) Provisional application No. 61/709,593, filed on Oct. 4, 2012, provisional application No. 61/638,940, filed on Apr. 26, 2012.

(51) Int. Cl.
*C23C 16/509* (2006.01)
*H01L 21/66* (2006.01)
*H01L 21/02* (2006.01)
*H01L 21/3065* (2006.01)
*H01J 37/32* (2006.01)
*H01L 21/687* (2006.01)
*H01L 21/67* (2006.01)
*H01L 21/683* (2006.01)
*C23C 14/22* (2006.01)
*C23C 16/44* (2006.01)

(52) U.S. Cl.
CPC .. *H01J 37/32082* (2013.01); *H01J 37/32467* (2013.01); *H01J 37/32522* (2013.01); *H01J 37/32541* (2013.01); *H01J 37/32605* (2013.01); *H01J 37/32642* (2013.01); *H01J 37/32697* (2013.01); *H01L 21/02104* (2013.01); *H01L 21/02274* (2013.01); *H01L 21/3065* (2013.01); *H01L 21/67069* (2013.01); *H01L 21/67109* (2013.01); *H01L 21/67248* (2013.01); *H01L 21/6833* (2013.01); *H01L 21/68735* (2013.01); *H01J 2237/334* (2013.01)

(56) References Cited

U.S. PATENT DOCUMENTS

| | | | |
|---|---|---|---|
| 5,316,645 A | 5/1994 | Yamagami et al. | |
| 5,332,880 A | 7/1994 | Kubota et al. | |
| 5,800,621 A * | 9/1998 | Redeker | H01J 37/321 118/723 AN |
| 6,039,836 A | 3/2000 | Dhindsa et al. | |
| 6,151,203 A | 11/2000 | Shamouilian et al. | |
| 6,232,236 B1 | 5/2001 | Shan et al. | |
| 6,358,573 B1 * | 3/2002 | Raoux | C23C 16/5096 427/578 |
| 6,486,081 B1 * | 11/2002 | Ishikawa | C23C 16/401 438/787 |
| 6,500,734 B2 * | 12/2002 | Anderson | C23C 16/45504 438/478 |
| 6,524,969 B2 * | 2/2003 | Li | C23C 16/466 438/479 |
| 6,795,292 B2 | 9/2004 | Grimard et al. | |
| 8,211,324 B2 | 7/2012 | Dhindsa et al. | |
| 8,734,664 B2 | 5/2014 | Yang et al. | |
| 8,988,848 B2 | 3/2015 | Todorow et al. | |
| 2002/0171994 A1 | 11/2002 | Grimard et al. | |
| 2003/0037881 A1 | 2/2003 | Barnes et al. | |
| 2003/0092266 A1 * | 5/2003 | Anderson | C23C 16/45504 438/689 |
| 2003/0201069 A1 | 10/2003 | Johnson | |
| 2004/0173156 A1 | 9/2004 | Stimson et al. | |
| 2006/0066247 A1 | 3/2006 | Koshiishi et al. | |
| 2006/0118518 A1 | 6/2006 | Rusu et al. | |
| 2010/0018648 A1 | 1/2010 | Collins et al. | |
| 2010/0040768 A1 | 2/2010 | Dhindsa | |
| 2010/0203736 A1 | 8/2010 | Ichino et al. | |
| 2010/0243620 A1 | 9/2010 | Yamawaku et al. | |
| 2010/0326600 A1 | 12/2010 | Park et al. | |
| 2010/0326957 A1 | 12/2010 | Maeda et al. | |
| 2011/0272100 A1 | 11/2011 | Koshiishi | |
| 2012/0006492 A1 | 1/2012 | Kikuchi et al. | |
| 2013/0107415 B2 | 5/2013 | Banna et al. | |
| 2013/0154175 A1 | 6/2013 | Todorow et al. | |
| 2013/0288483 A1 | 10/2013 | Sadjadi et al. | |
| 2014/0034239 A1 | 2/2014 | Yang et al. | |
| 2014/0069584 A1 | 3/2014 | Yang et al. | |

OTHER PUBLICATIONS

Butler, J.E., et al., "Understanding the chemical vapor deposition of diamond: recent progress". J. Phys. Condens. Matter 21 (2009) 364201 (pp. 1-20).*
Hebner, Gregory, A., et al., "Frequency dependent plasma characteristics in a capacitively coupled 300 mm wafer plasma processing chamber". Plasma Sources Sci. Technol. 15 (2006) pp. 879-888.*
Schropp, R.E.I., "Industrialization of Hot Wire Chemical Vapor Deposition for thin film applications". Thin Solid Films 595 (2015) pp. 272-283.*
PCT international search report and written opinion of PCT/US2013/035006 dated Jul. 26, 2013.

* cited by examiner

METHODS AND APPARATUS FOR CONTROLLING SUBSTRATE UNIFORMITY

RELATED APPLICATIONS

This application is a divisional of U.S. patent application Ser. No. 13/766,238, filed Feb. 13, 2013, which claims priority to U.S. Patent Application Ser. No. 61/638,940, filed on Apr. 26, 2012, and U.S. Patent Application Ser. No. 61/709,593, filed on Oct. 4, 2012, both of which are incorporated by reference in their entirety.

BACKGROUND

Field of the Invention

The present invention generally relates to methods and apparatus for semiconductor manufacturing. Specifically, embodiments described herein relate to plasma processing chambers and process kits for semiconductor substrates.

Description of the Related Art

Integrated circuits have evolved into complex devices that can include millions of components (e.g., transistors, capacitors and resistors) on a single chip. The evolution of chip designs continually requires faster circuitry and greater circuit density. The demands for greater circuit density necessitate a reduction in the dimensions of the integrated circuit components.

For over 50 years, the number of transistors formed on an integrated circuit has doubled approximately every two years. This two-year-doubling trend, also known as Moore's Law, is projected to continue, with devices formed on semiconductor chips shrinking from the current critical dimension of 20-30 nm to 0-5 nm in future fabrication processes currently being designed. As device geometries shrink, fabrication geometries grow. As the 300 mm wafer replaced the 128 mm wafer years ago, the 300 mm wafer will shortly be replaced by the 450 mm wafer. With processing of large area semiconductor substrate growing in sophistication, even larger fabrication geometries for logic chips may be within reach.

Uniformity in processing conditions has always been important to semiconductor manufacturing, and as critical dimensions of devices continue to decline and fabrication geometries increase, tolerance for non-uniformity also declines. Non-uniformity arises from numerous causes, which may be related to device properties, equipment features, and the chemistry and physics of fabrication processes. As the semiconductor manufacturing industry progresses along Moore's Law, there is a continuing need for fabrication processes and equipment capable of very uniform processing.

SUMMARY

Embodiments described herein provide a dynamically tunable process kit, a processing chamber having a dynamically tunable process kit, and a method for processing a substrate using a dynamically tunable process kit. The dynamically tunable process kit allows for one or both of the electrical and thermal state of the process kit to be changed without changing the physical construction of the process kit, thereby allowing plasma properties, and hence processing results, to be easily changed without replacing the process kit.

In one embodiment, a process kit for a plasma processing chamber is provided that includes a top ring and a base ring adapted to concentrically support the top ring. The top and base rings have an inside diameter selected to circumscribe a semiconductor wafer. The base ring has a connector configured to couple a signal to the base ring for external control of one or both of a thermal state and an electrical state of the base ring.

In another embodiment, a processing chamber having a dynamically tunable process kit is provided. The processing chamber includes a chamber body having a substrate transfer opening and an internal volume. the chamber body includes a conductive side wall having a first portion configured to be electrically controlled independently from remaining portions of the conductive side wall. A substrate support assembly is disposed in the internal volume of the chamber body and has a process kit disposed thereon. The process kit includes a top ring and a base ring adapted to concentrically support the top ring. The top and base rings have an inside diameter selected to circumscribe a semiconductor wafer. The base ring has a connector configured to couple a signal to the base ring for external control of one or both of a thermal state and an electrical state of the base ring.

In yet another embodiment, a method for processing a substrate in a processing chamber is provided that includes transferring a substrate into the processing chamber having a process kit disposed on a substrate support assembly. The process kit includes a base ring adapted to concentrically support a top ring, the top and base rings having an inside diameter selected to circumscribe a semiconductor wafer. The base ring has a connector configured to couple a signal to the base ring for external control of one or both of a thermal state and an electrical state of the base ring. The method further includes setting one or both of electrical and thermal states of the process kit, forming a plasma within the processing chamber, and processing the substrate in the presence of the plasma.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments described herein provide a dynamically tunable process kit, a processing chamber having a dynamically tunable process kit, and a method for processing a substrate using a dynamically tunable process kit. Advantageously, the dynamically tunable process kit allows for one or both of the electrical and thermal state of the process kit to be changed without changing the physical construction of the process kit, thereby allowing plasma properties, and hence processing results, to be easily changed without replacing the process kit. The dynamically tunable process kit allows for greater process flexibility and reduced chamber downtime as processes conventionally requiring process kits having different physical construction may now be run using a single process kit whose electrical state and/or temperature is tunable to enable to emulate the results which could previously be obtained only by exchanging one process kit for another.

Figure 1:
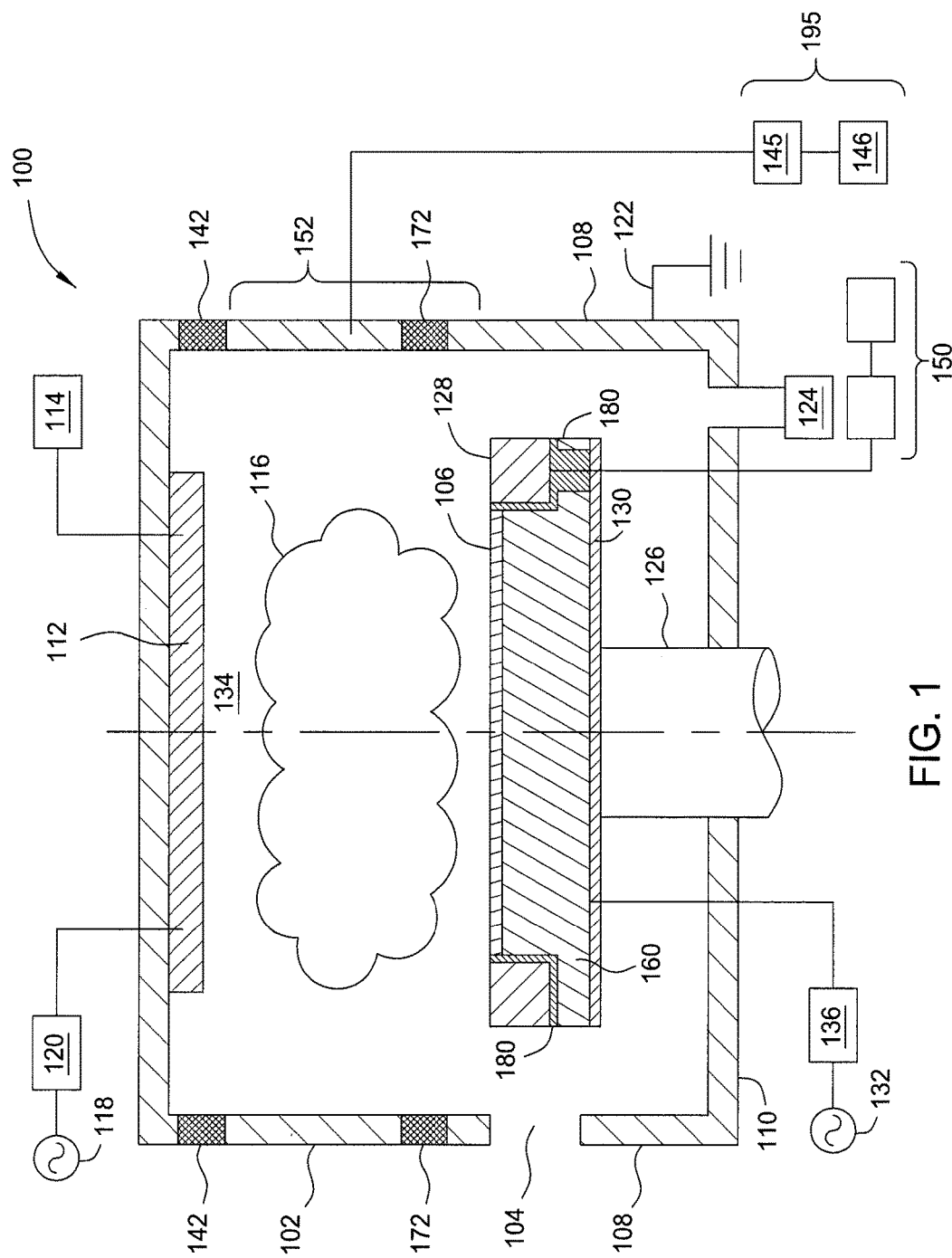
FIG. 1 depicts a schematic cross-sectional view of a plasma processing chamber having a dynamically tunable process kit according to one embodiment.

FIG. 1 is a schematic cross-sectional view of a processing chamber 100 according to one embodiment. Processing chamber 100 may include, but is not limited to, a capacitively coupled plasma processing chambers, inductively coupled plasma processing chambers, and the like. Although the processing chamber 100 is depicted in FIG. 1 as an etch chamber, the processing chamber 100 may be configured as a physical vapor deposition (PVD) chamber, chemical vapor deposition (CVD) chamber, an ion implant chamber, a plasma treatment chamber, an ashing chamber or other plasma processing chamber.

The processing chamber 100 includes a conductive chamber body 102, which may be aluminum or stainless steel, or other suitable material. The chamber body 102 comprises a conductive side wall 108 and bottom wall 110, which enclose an internal volume. The side wall 108 is connected to an electrical ground 122. The chamber body 102 has a substrate transfer opening 104 disposed in side wall 108. The chamber body 102 has a pumping port coupled to a pumping system 124 for controlling pressure within the internal volume of the chamber body and for removing process by-products during processing.

A substrate transfer opening 104 allows substrates to be transferred into and out of the processing chamber 100 and is sealable via a slit valve (not shown). A substrate handling device, such as a robot (not shown), is utilized to transfer a substrate 106 into and out of the processing chamber 100 through the substrate transfer opening 104.

The processing chamber 100 includes an upper electrode 112. In one embodiment, the upper electrode 112 is coupled to a RF power source 118 through a matching circuit 120 and is utilized for generating and/or maintaining a plasma 116 in the internal volume of the processing chamber 100. In one embodiment, upper electrode 112 is a gas distributor coupled to a gas panel 114 to admit process gasses into processing chamber 100 from which the plasma 116 is formed. Gas distributor 112 may be a nozzle, a gas distribution plate, or the like. It is contemplated that the gasses may be introduced into the internal volume in another manner. In another embodiment (not shown), a separate electrode may be utilized to couple RF power source 118 and matching circuit 120 to form the plasma 116 in processing chamber 100.

A substrate support assembly 126 having a ring-shaped process kit 128 disposed thereon is disposed in the internal volume of the chamber body 102. The substrate support assembly 126 may be supported from the bottom wall 110 or the side wall 108 of the chamber body. Substrate support assembly 126 may include a lower electrode 130 positioned below upper electrode 112. In one embodiment, the lower electrode 130 is coupled to a RF power source 132 through a matching circuit 136.

The substrate support assembly 126 may include an electrostatic chuck disposed on a cooling base 160. The electrostatic chuck may be coupled to the RF power source 132 through a matching circuit 136. The cooling base 160 has temperature control elements, such as conduits for flowing a heat transfer fluid, utilized control the temperature of the electrostatic chuck.

The process kit 128 is disposed on an outer perimeter of the electrostatic chuck and substantially circumscribes the substrate 106. In one embodiment, the process kit 128 is insulated from the outer perimeter of the electrostatic chuck, the outer perimeter of the cooling base 160 and/or the lower electrode 130 by a suitable insulating material 180. In one embodiment, the process kit 128 is coupled to a control system 150 such that the electrical state of the process kit 128 may be controlled.

Figure 2:
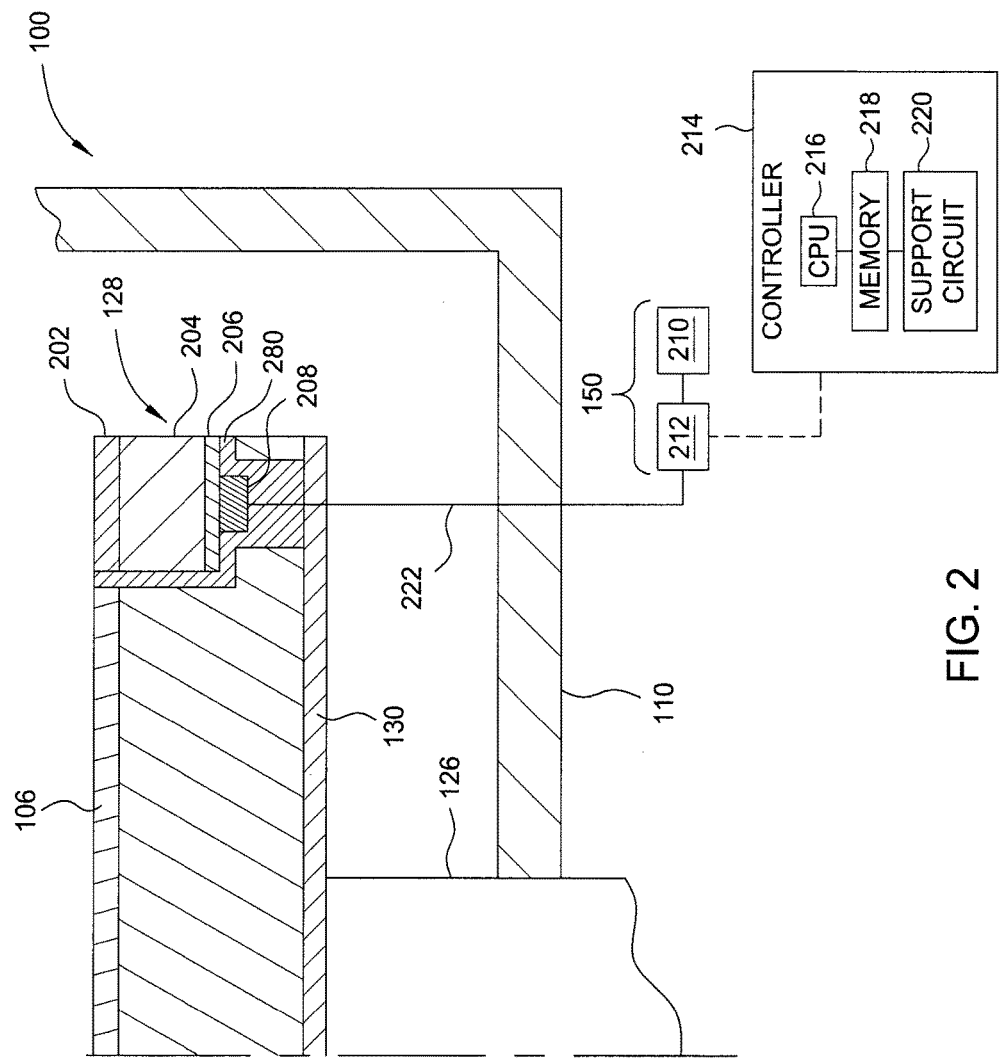
FIG. 2 depicts an enlarged partial schematic cross-sectional view of the plasma processing chamber and having a dynamically tunable process kit of FIG. 1.

FIG. 2 is a partial schematic cross-sectional view of the processing chamber 100 of FIG. 1 illustrating the process kit 128 in greater detail. The process kit 128 includes one or more rings. In the embodiment of FIG. 2, the process kit 128 includes a top ring 202 concentrically disposed on a base ring 204. The top ring 202 is fabricated from at least one of silicon, silicon carbide, quartz, or other suitable material. Alternatively, the top ring 202 may be fabricated from a base material that is coated with at least one of silicon, silicon carbide, quartz or other suitable material. The base ring 204 may be fabricated from quartz or other suitable material.

In one embodiment, the process kit 128 includes a conductive layer 206 which may be electrically biased in a controllable manner by the control system 150 to provide a tunable electrical potential (e.g., electrical state) to the process kit 128. In one embodiment, the conductive layer 206 is a metal layer located below or on top of the base ring 204. The conductive layer 206 may be affixed to the base ring 204 or to the top ring 202. In another embodiment, the conductive layer 206 is embedded in the base ring 204 or the top ring 202. The conductive layer 206 may be a solid metal, a foil, a metal mesh or other suitable conductive material.

The conductive layer 206 is coupled to the control system 150 by a connector 208 and a lead 222. The lead 222 is routed through the substrate support assembly 126. In one embodiment, the connector 208 and the lead 222 are insulated from the cooling base 160 and the lower electrode 130 by a suitable insulating material 280. The connector 208 interfaces with a bottom of the conductive layer 206 to shield the connection from the environment within the chamber body 102. The control system 150 is operable to control one or both of the electrical and thermal state of the process kit while disposed on the substrate support in the internal volume of the chamber body. In one embodiment, the connector 208 is a conductive pad or spring. The weight of the top ring 202 and the base ring 204 on conductive layer 206 creates good electrical contact between conductive layer 206 and connector 208. The connector 208 may alternatively be a bayonet connector, pin connector or any other suitable electrical connector.

In one embodiment, the control system 150 includes a DC power source 210 and a tuning circuit 212 coupled to the connector 208 by the lead 222. The tuning circuit 212 is configured to control various processing parameters of the process kit 128. The tuning circuit 212 is operable to vary its capacitance, inductance, and/or resistance as to set the electrical bias applied to the process kit 128 by the DC power source 210. Additional details about the tuning circuit 212 will be discussed further below.

In one embodiment, the control system 150 is coupled to a controller 214 to control various states of the processing kit 128. The controller 214, including a central processing unit (CPU) 216, a memory 218, and support circuits 220, is coupled to the various components of the processing chamber 100 to facilitate control of plasma processing in the present invention. The memory 218 can be any computer-readable medium, such as random access memory (RAM), read only memory (ROM), floppy disk, hard disk, or any other form of digital storage, local or remote to the processing chamber 100 or the CPU 216. The support circuits 220 are coupled to the CPU 216 for supporting the CPU 216 in a conventional manner. These circuits include cache, power supplies, clock circuits, input/output circuitry and subsystems, and the like. A software routine or a series of program instructions stored in the memory 218, when executed by the CPU 216, controls processes performed the in the processing chamber 100 and/or causes the control system 150 to control the thermal and/or electrical state of the process kit 128.

In operation, the process kit 128 influences plasma characteristics in a processing region 134 which effects etch (or deposition) performance processing at the edges of the substrate 106. By controlling the state of the process kit 128, for example by controlling an electrical potential of the process kit 128 by dynamically selecting at least one of capacitance, impedance and resistance of the tuning circuit 212, the process kit 128 can advantageously control the physical attributes of plasma to provide control of processing at edges of substrate 106. For example, applying a negative potential to the process kit 128 will draw positive species within the plasma outward relative to the edge of the substrate 106 and vice versa.

Figure 3:
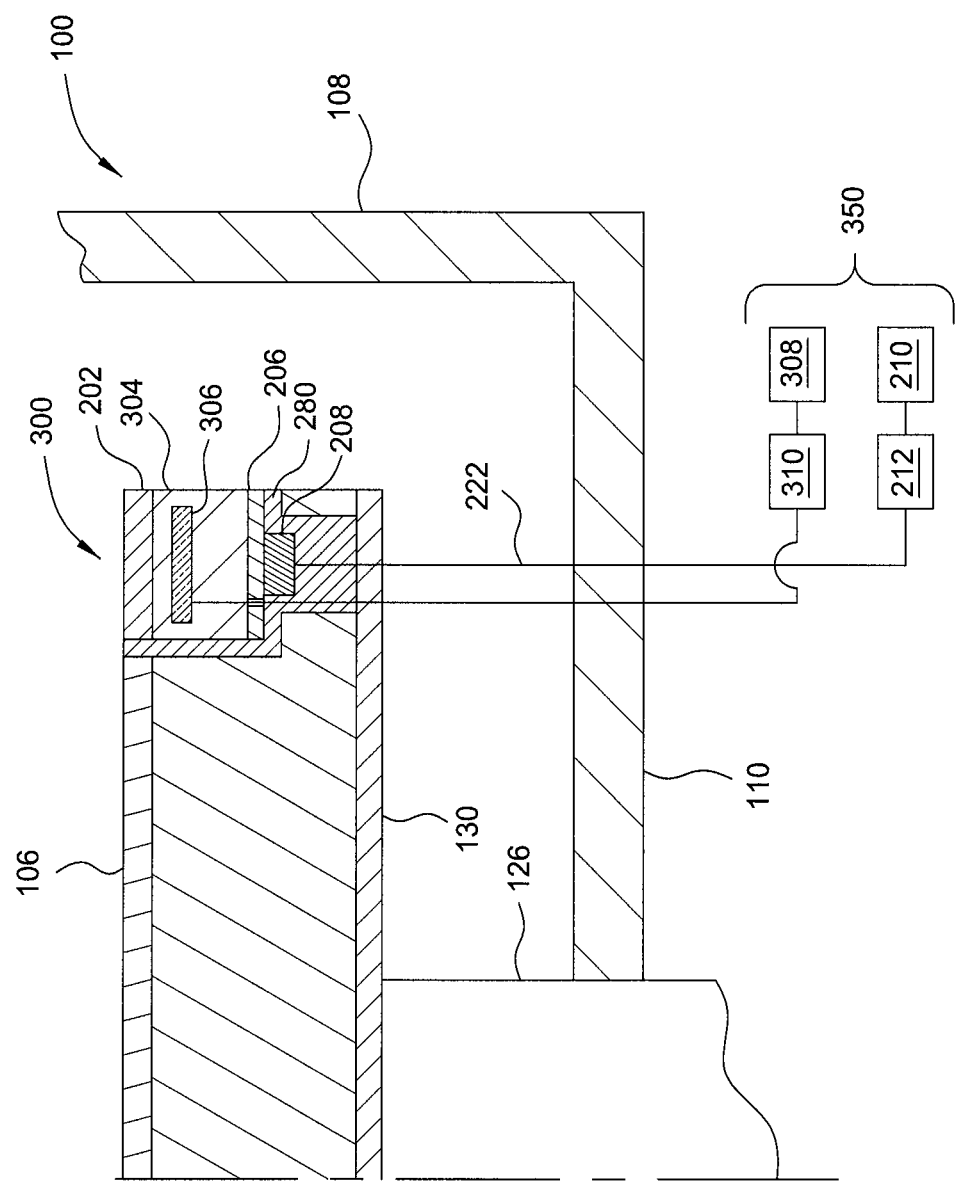
FIG. 3 depicts a partial schematic cross-sectional view of another embodiment of a plasma processing chamber having a dynamically tunable process kit.

FIG. 3 is another embodiment of a process kit 300 that includes a heating element 306 embedded within a base ring 304 that enables the thermal state of the process kit 300 to be controlled. The heating element 306 is coupled to a control system 350. The connection between the heating element 306 and the control system 350 is made through the bottom of the process kit 300 to shield the connection from the processing chamber 100 environment. The control system 350 is operable to control the thermal state of the process kit 300. In one embodiment, the control system 350 includes a power source 308 and a filter element 310 coupled to the heating element 306. The filter element 310 is configured to protect the power source 308 from RF power used to drive plasma.

The control system 350 may optionally also control the electrical state of the process kit 300. In one embodiment, the control system 350 also includes the DC power source 210 and the tuning circuit 212 to control the electrical state of the process kit 300, as described with reference to FIG. 2. The thermal and electrical states of process kit 300 may be independently controlled by the control system 350. In one embodiment, the controller 214 controls both the temperature of the heating element 306 and the tuning circuit 212 to control plasma processing in the processing chamber 100. In an exemplary operation, heating element 306 advantageously controls polymer deposition during etching by controlling the temperature of the process kit 300. For example, a hotter process kit 300 will cause more polymer to stick on the side walls 108 or features being etched near the edges of the substrate 106, therefore controlling profile uniformity across the substrate 106.

Figure 4:
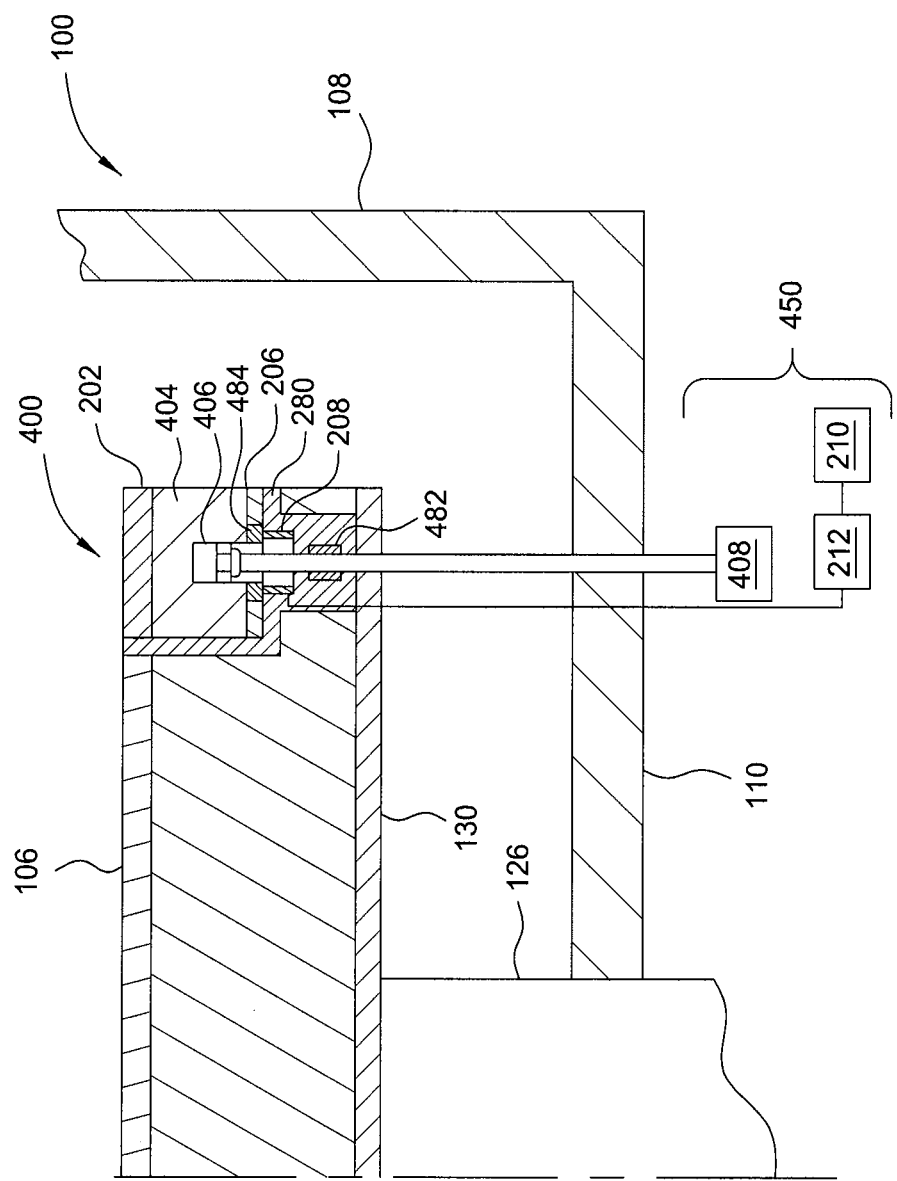
FIG. 4 depicts a partial schematic cross-sectional view of another embodiment of a plasma processing chamber having a dynamically tunable process kit.

FIG. 4 is another embodiment of a process kit 400 that includes a temperature control feature 406 embedded within or formed within a base ring 404 that enables the thermal state of the process kit 400 to be controlled. The temperature control feature 406 may be a conduit or passage for flowing a heat transfer medium, such as a gas, liquid or combination thereof. The temperature control feature 406 is coupled to a control system 450. The control system 450 is operable to control the thermal state of process kit 400. In one embodiment, the control system 450 includes a heat transfer medium supply 408 coupled to the temperature control feature 406. The connection between temperature control feature 406 and the control system 450 is made through the bottom of the process kit 400 to shield the connection from the processing chamber 100 environment. The heat transfer medium supply 408 is configured to provide a heat transfer medium at a predefined temperature that is circulated through the temperature control feature 406 to heat or cool the process kit 400 as desired. In another embodiment, the temperature control feature 406 includes an insulating material 484 disposed at the conductive layer 206. The insulating material 484 may be a breaker to prevent a short circuit, for example a DC breaker. In another embodiment, the temperature control feature 406 includes an RF breaker 482 disposed in the insulating material 280 to prevent a short circuit.

The control system 450 may optionally also control the electrical state of the process kit 400. In one embodiment, the control system 450 also includes the DC power source 210 and the tuning circuit 212 to control the electrical state of the process kit 400, as described with reference to FIG. 2. The thermal and electrical states of the process kit 400 may be independently controlled by the control system 450. In one embodiment, the controller 214 controls both the temperature control feature 406 and the tuning circuit 212 to control plasma processing in the processing chamber 100. In an exemplary operation, the temperature control feature 406 advantageously controls polymer deposition during etching by controlling the temperature of the process kit 400. For example, a cooler process kit 400 will cause less polymer to stick on the side walls or feature being etched near the edges of substrate 106, therefore controlling profile uniformity across the substrate 106.

Figure 5:
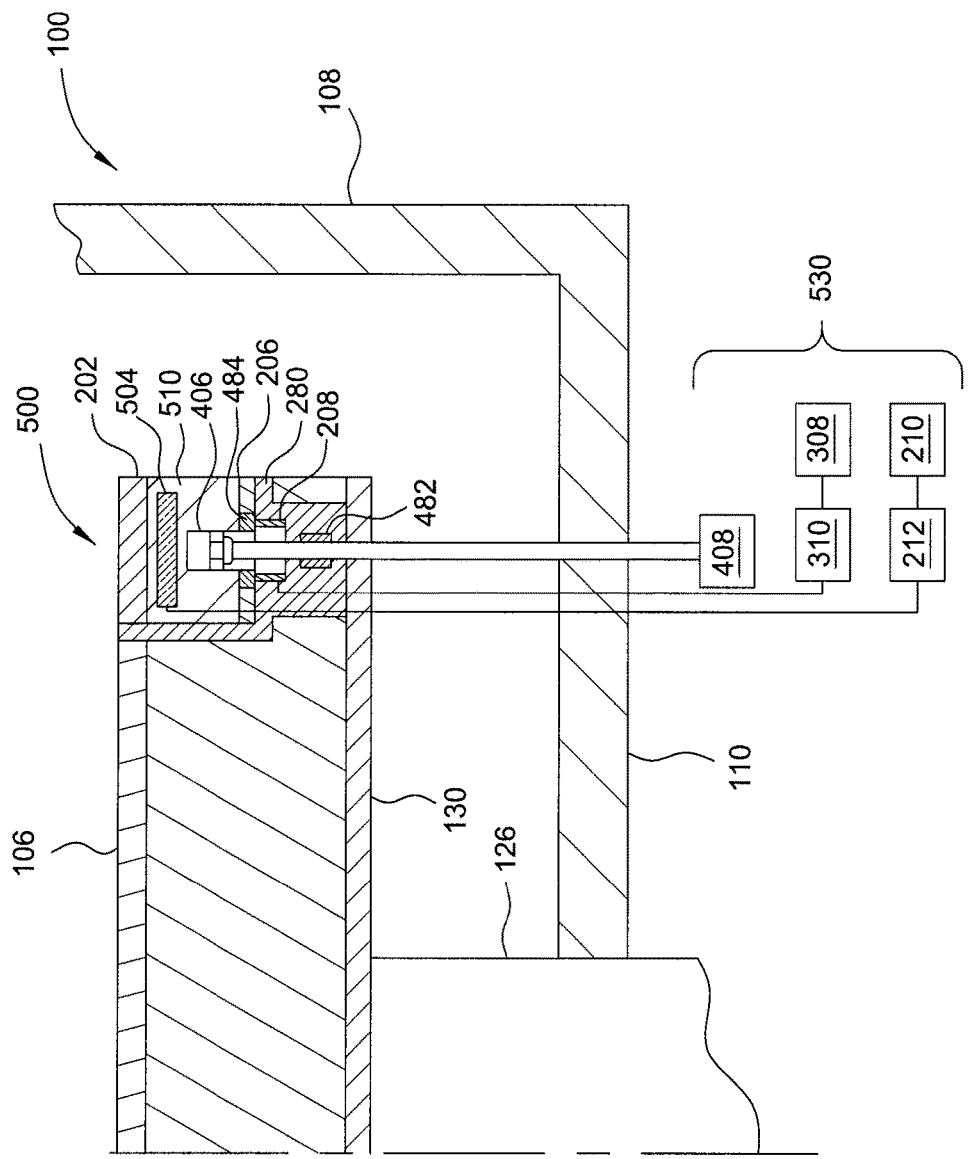
FIG. 5 depicts a partial schematic cross-sectional view of another embodiment of a plasma processing chamber having a dynamically tunable process kit.

FIG. 5 is another embodiment of a process kit 500 that includes both a heating element 504 and the temperature control feature 406 embedded within the process kit 500 that enables the thermal state of the process kit 500 to be controlled. In one embodiment, the heating element 504 is embedded in a base ring 510. In one embodiment, the heating element 504 is a resistive heater. The heating element 504 and the temperature control feature 406 are coupled to a control system 530. The control system 530, coupled to the heating element 504 and the temperature control feature 406, is operable to control the thermal state of the process kit 500. In one embodiment, the control system 530 includes the power source 308 and the filter element 310 coupled to the heating element 504, as described with reference to FIG. 3. The control system 530 also includes the heat transfer medium supply 408 coupled to the temperature control feature 406, as described with reference to FIG. 4.

The control system 530 may optionally control the electrical state of the process kit 500. In one embodiment, the control system 530 also includes the DC power source 210 and the tuning circuit 212 coupled to the conductive layer 206 to control the electrical state of the process kit 500, as described with reference to FIG. 2. The thermal and electrical states of process kit 500 may be independently controlled by the control system 530. In one embodiment, the controller 214 interfaces with the control system 530 to control the temperature of the heating element 504 and the temperature control feature 406 to control the thermal state of the process kit 500. In another embodiment, the controller 214 interfaces with the control system 530 to control one or both of the temperature of the heating element 504 and the temperature control feature 406 along with the tuning circuit 212 to control the thermal and electrical state of the process kit 500.

Referring back to FIG. 1, a portion 152 of side wall 108 located laterally outward of the processing region 134 may optionally be electrically controlled relative to other portions of the side walls 108, which are grounded. The portion 152 of side wall 108 is bounded by insulators 142 and 172 that enable the electrical state of the portion 152 of the side wall 108 to be controlled. The portion 152 of the side wall 108 is coupled to a control system 195 operable to control the electrical state of the portion 152 of the side wall 108. In one embodiment, the control system 195 includes a power source 146 and a tuning circuit 145 coupled to the portion 152 of side wall 108 to control the electrical state of the portion 152 of side wall 108. The power source 146 may be a DC power source or an RF power source. The tuning circuit 145 has the same properties as described above for the tuning circuit 212 with respect to a process kit to control the electrical state of the portion 152 of the side wall 108 by applying a negative or positive bias to the portion 152 of the side wall 108. It is noted that process kits 128, 300, 400 and 500 may be utilized in the processing chamber 100 having an electrical state of the portion 152 of the side wall 108 electrically controlled relative to the grounded state of the remaining portion of the side wall 108.

While the foregoing is directed to embodiments of the present invention, other and further embodiments of the invention may be devised without departing from the basic scope thereof, and the scope thereof is determined by the claims that follow.

What is claimed is:

1. A method for processing a substrate in a processing chamber comprising:
   transferring a substrate into the processing chamber having a process kit disposed on a substrate support assembly, the process kit comprising:
      a top ring; and
      a base ring adapted to concentrically support the top ring, the top and base rings having an inside diameter selected to circumscribe a semiconductor wafer;
      a conductive layer coupled to a bottom surface of the base ring; and
      a connector coupled to the conductive layer, wherein the connector is disposed below and in direct contact with a bottom of the conductive layer interfacing with the connector, and wherein the connector includes a tuning circuit configured to couple to the conductive layer for external and independent control of a thermal state and an electrical state of the base ring through the conductive layer;
   setting one or both of electrical and thermal states of the process kit;
   forming a plasma within the processing chamber; and
   processing the substrate in the presence of the plasma.

2. The method of claim 1 further comprising:
   setting an electrical state of a first portion of a side wall of the processing chamber independently from remaining portions of the side wall.

3. The method of claim 2, wherein setting the electrical state of the process kit or side wall of the processing chamber comprises tuning an electrical bias applied to the process kit or the conductive side wall.

4. The method of claim 3, wherein tuning the electrical bias comprises varying processing parameters comprising: a capacitance, an inductance and a resistance of the electrical bias.

5. The method of claim 1, wherein setting one or both of electrical and thermal states further comprises:
   supplying thermal energy to the process kit from a heating element coupled to the connector.

6. The method of claim 5, wherein the heating element is embedded in the base ring.

7. The method of claim 1, wherein the base ring further comprises a temperature control feature configured to enable the thermal state of the process kit to be controlled.

8. The method of claim 1, further comprising an insulating material disposed on an inside diameter of at least one of the base ring and the top ring.

9. The method of claim 1, wherein the top ring is fabricated from or coated with a material selected from the group consisting of silicon, silicon carbide and quartz.

10. A method for processing a substrate in a processing chamber comprising:
    setting one or both of electrical and thermal states of a process kit configured to circumscribe a substrate support disposed in a processing chamber, wherein the process kit further comprises:
    the process kit comprising:
       a top ring; and
       a base ring adapted to concentrically support the top ring, the top and base rings having an inside diameter selected to circumscribe a semiconductor wafer, the base ring having a connector configured to couple a signal to the base ring for external control of one or both of a thermal state and an electrical state of the base ring; and
    setting an electrical state of a first portion of a side wall of the processing chamber independently from remaining portions of the side wall.

11. The method of claim 10, wherein setting the electrical state of the process kit or side wall of the processing chamber comprises tuning an electrical bias applied to the process kit or the conductive side wall.

12. The method of claim 11, wherein tuning the electrical bias comprises varying processing parameters comprising: a capacitance, an inductance and a resistance of the electrical bias.

* * * * *